US011709196B2

(12) United States Patent
Minn et al.

(10) Patent No.: US 11,709,196 B2
(45) Date of Patent: Jul. 25, 2023

(54) METHOD AND APPARATUS FOR DETECTING CIRCUIT DEFECTS

(71) Applicant: Samsung Electronics Co., Ltd., Suwon-si (KR)

(72) Inventors: Donggyu Minn, Suwon-si (KR); Daehyun Kang, Suwon-si (KR); Yonghoon Kim, Suwon-si (KR); Jihoon Kim, Suwon-si (KR); Hyundo Ryu, Suwon-si (KR); Jeeho Park, Suwon-si (KR); Sunggi Yang, Suwon-si (KR); Youngchang Yoon, Suwon-si (KR); Sehyug Jeon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 48 days.

(21) Appl. No.: 17/378,592

(22) Filed: Jul. 16, 2021

(65) Prior Publication Data

US 2022/0018892 A1    Jan. 20, 2022

(30) Foreign Application Priority Data

Jul. 16, 2020    (KR) .................. 10-2020-0088023

(51) Int. Cl.
*G01R 31/28*    (2006.01)
*G01R 31/3167*    (2006.01)
*G01R 27/32*    (2006.01)

(52) U.S. Cl.
CPC ......... *G01R 31/2822* (2013.01); *G01R 27/32* (2013.01); *G01R 31/3167* (2013.01)

(58) Field of Classification Search
CPC ............... G01R 31/2822; G01R 27/32; G01R 31/3167; G01R 31/2837; G01R 19/165; G01R 23/02; G01R 27/08; G01R 31/2843
See application file for complete search history.

(56) References Cited

U.S. PATENT DOCUMENTS

| 5,903,422 | A  |   | 5/1999 | Hosokawa         |              |
|-----------|----|---|--------|------------------|--------------|
| 7,511,527 | B1 | * | 3/2009 | Tiew ............ | G01R 31/275  |
|           |    |   |        |                  | 324/762.08   |
| 2007/0075215 | A1 |   | 4/2007 | Giovannini et al. |           |
| 2007/0126501 | A1 | * | 6/2007 | Kim ............ | H03G 1/007  |
|           |    |   |        |                  | 330/86       |

(Continued)

FOREIGN PATENT DOCUMENTS

| JP | 2009-170735 A    | 7/2009 |
| KR | 10-2008-0050447 A | 6/2008 |
| KR | 10-2012-0055486 A | 5/2012 |

OTHER PUBLICATIONS

International Search Report dated Oct. 26, 2021 in connection with International Patent Application No. PCT/KR2021/009209, 3 pages.

(Continued)

*Primary Examiner* — Akm Zakaria

(57) ABSTRACT

The disclosure relates to an RFIC apparatus, and more particularly, to an RFIC circuit having a test circuit, a test apparatus, and a test method thereof. Further, the disclosure relates to a method for estimating or determining a DC gain using a test apparatus and an RF circuit in a DC/AC test stage, and detecting defects of the RF circuit based on the estimated or determined DC gain.

16 Claims, 10 Drawing Sheets

(56) References Cited

U.S. PATENT DOCUMENTS

| | | | |
|---|---|---|---|
| 2008/0303496 A1* | 12/2008 | Schlueter | G05F 1/575 323/273 |
| 2011/0095826 A1* | 4/2011 | Hadjichristos | H04B 1/0466 455/67.11 |
| 2012/0126821 A1 | 5/2012 | Forstner | |
| 2013/0049735 A1 | 2/2013 | Shafer et al. | |
| 2013/0324062 A1 | 12/2013 | Wang et al. | |
| 2017/0023966 A1 | 1/2017 | Kim et al. | |
| 2021/0080498 A1* | 3/2021 | Tadepalli | G01R 31/2837 |

OTHER PUBLICATIONS

Written Opinion of the International Searching Authority dated Oct. 26, 2021 in connection with International Patent Application No. PCT/KR2021/009209, 3 pages.

* cited by examiner

METHOD AND APPARATUS FOR DETECTING CIRCUIT DEFECTS

CROSS-REFERENCE TO RELATED APPLICATION

This application is based on and claims priority under 35 U.S.C. § 119 to Korean Patent Application No. 10-2020-0088023 filed on Jul. 16, 2020 in the Korean Intellectual Property Office, the disclosure of which is herein incorporated by reference in its entirety.

BACKGROUND

1. Field

The disclosure relates to an RFIC apparatus, and more particularly, to an RFIC circuit having a test circuit, a test apparatus, and a test method thereof.

2. Description of Related Art

To meet the demand for wireless data traffic having increased since deployment of 4G communication systems, efforts have been made to develop an improved 5th generation (5G) or pre-5G communication system. Therefore, the 5G or pre-5G communication system is also called a 'Beyond 4th generation (4G) Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid frequency shift keying (FSK) and quadrature amplitude modulation (QAM) Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud RAN as the above-described Big Data processing technology may also be considered to be as an example of convergence between the 5G technology and the IoT technology.

Recently, in order to achieve a high data transmission rate, a transmission/reception gain of the RF circuit has become important more and more. Thus, there is need for a test method for detecting defects of an RF circuit and optimizing the performance of the RF circuit in a process of manufacturing the RF circuit.

SUMMARY

An aspect of the disclosure is to provide a method and an apparatus for detecting defects of an RF circuit by estimating an RF gain through a DC test before a package process using a test circuit of the RF circuit, in a process of manufacturing an RFIC circuit.

Another aspect of the disclosure is to provide a test circuit for detecting defects of an RF circuit in a process of manufacturing the RF circuit.

According to embodiments of the disclosure to solve the above problems, a method for testing a radio frequency (RF) circuit of a test apparatus includes: generating a DC current of a test circuit and identifying a reference resistance by measuring a potential difference between both ends of a reference resistor; determining a first drain source current of a transistor circuit based on the reference resistance and a first drain voltage of the transistor circuit, being applied by the test circuit; determining a second drain source current of the transistor circuit based on the reference resistance and a second drain voltage of the transistor circuit, being applied by the test circuit; determining a drain resistance based on the first drain voltage, the second drain voltage, the first drain source current, and the second drain source current; and performing a test of the RF circuit based on the drain resistance, the first drain source current, and a predetermined threshold value.

Further, according to embodiments of the disclosure, a test apparatus for performing a test based on a DC voltage gain includes: an operation unit configured to perform an operation based on a voltage or current measured by a test circuit and an analog-to-digital converter (ADC) in an RF circuit; and a controller configured to: generate a DC current of the test circuit and identify a reference resistance by measuring a potential difference between both ends of a reference resistor, determine a first drain source current of a transistor circuit based on the reference resistance and a first drain voltage of the transistor circuit, being applied by the test circuit, determine a second drain source current of the transistor circuit based on the reference resistance and a second drain voltage of the transistor circuit, being applied by the test circuit, determine a drain resistance based on the first drain voltage, the second drain voltage, the first drain source current, and the second drain source current, and perform a test of the RF circuit based on the drain resistance, the first drain source current, and a predetermined threshold value.

Further, according to embodiments of the disclosure, a radio frequency (RF) circuit for performing a test based on a DC voltage gain includes: a transistor circuit configured to transmit and receive signals; a test circuit configured to generate a DC current for the test and apply a drain voltage to the transistor circuit; and a register controller configured to: control the test circuit to generate a DC current to identify a reference resistance, control the test circuit to apply a first drain voltage to the transistor circuit to determine a first drain source current of the transistor circuit, and control the test circuit to apply a second drain voltage to the transistor circuit to determine a second drain source current of the transistor circuit, wherein the register controller is a controller configured to control an RF test device to determine a drain resistance and detect defects by measuring a DC gain.

According to the embodiments of the disclosure, it is possible to efficiently detect the defects of the RF circuit by detecting the defects of the RF circuit through estimation of the RF gain through the DC test before the package process.

Effects that can be obtained in the disclosure are not limited to the above-described effects, and other unmentioned effects can be clearly understood by those of ordinary skill in the art to which the disclosure pertains from the following description.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
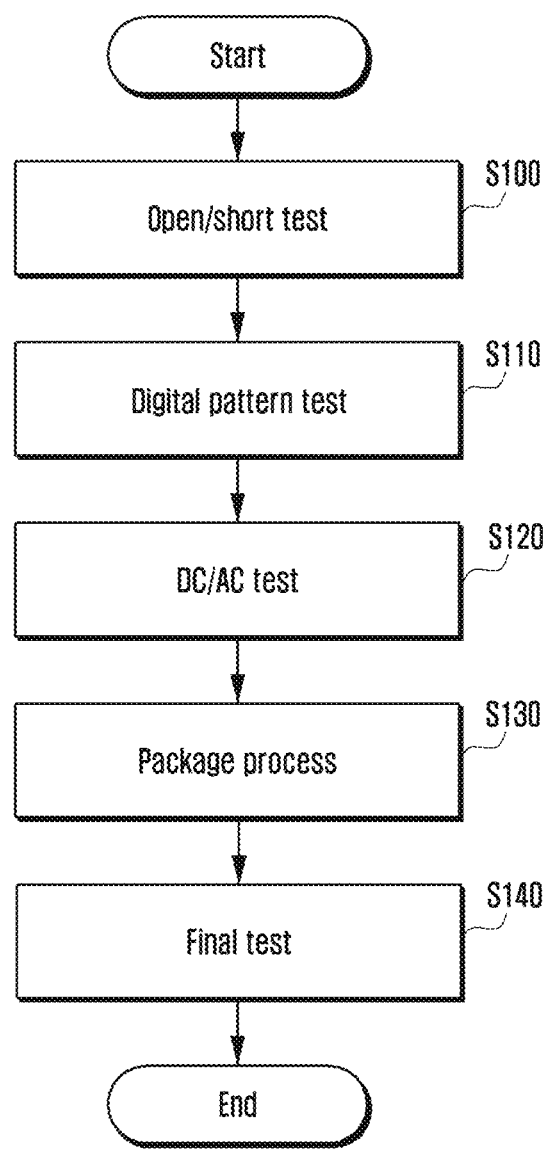
FIG. 1 illustrates a flowchart of detecting defects of an RF circuit according to an embodiment of the disclosure.

FIGS. 1 through 9, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, embodiments of the disclosure will be described in detail. Descriptions of functions and structures well known in the art and not directly related to the disclosure may be omitted for clarity and conciseness without obscuring the subject matter of the disclosure.

In the drawings, some elements are exaggerated, omitted, or only outlined in brief, and thus may be not drawn to scale. The same or similar reference symbols are used throughout the drawings to refer to the same or like parts.

The aspects, features, and advantages of certain embodiments of the disclosure will be more apparent from the following detailed description taken in conjunction with the accompanying drawings. The description of the various embodiments is to be construed as exemplary only and does not describe every possible instance of the disclosure. It should be apparent to those skilled in the art that the following description of various embodiments of the disclosure is provided for illustrative purposes only and not for the purpose of limiting the disclosure as defined by the appended claims and their equivalents. The same reference symbols are used throughout the description to refer to the same parts.

Meanwhile, it is known to those skilled in the art that blocks of a flowchart (or sequence diagram) and a combination of flowcharts may be represented and executed by computer program instructions. These computer program instructions may be loaded on a processor of a general purpose computer, special purpose computer, or programmable data processing equipment. When the loaded program instructions are executed by the processor, they create a means for carrying out functions described in the flowchart. As the computer program instructions may be stored in a computer readable memory that is usable in a specialized computer or a programmable data processing equipment, it is also possible to create articles of manufacture that carry out functions described in the flowchart. As the computer program instructions may be loaded on a computer or a programmable data processing equipment, when executed as processes, they may carry out steps of functions described in the flowchart.

A block of a flowchart may correspond to a module, a segment or a code containing one or more executable instructions implementing one or more logical functions, or to a part thereof. In some cases, functions described by blocks may be executed in an order different from the listed order. For example, two blocks listed in sequence may be executed at the same time or executed in reverse order.

In the description, the word "unit", "module", or the like may refer to a software component or hardware component such as an FPGA or ASIC capable of carrying out a function or an operation. However, "unit" or the like is not limited to hardware or software. A unit or the like may be configured so as to reside in an addressable storage medium or to drive one or more processors. Units or the like may refer to software components, object-oriented software components, class components, task components, processes, functions, attributes, procedures, subroutines, program code segments, drivers, firmware, microcode, circuits, data, databases, data structures, tables, arrays, or variables. A function provided by a component and unit may be a combination of smaller components and units, and it may be combined with others to compose large components and units. Components and units may be configured to drive a device or one or more processors in a secure multimedia card. In one embodiment, a unit or module may include one or more processors.

A test apparatus according to an embodiment of the disclosure is an apparatus capable of performing one or more tests for executing logical function(s), and when performing an RF circuit test to be described later, the test apparatus does not need to perform the overall test function, and may be implemented as a separate test apparatus for performing each RF circuit test.

Further, according to the disclosure, a radio frequency (RF) circuit may mean a radio frequency integrated circuit (RFIC), a nonvolatile memory device, or a semiconductor.

Further, according to the disclosure, a DC gain may mean a DC voltage gain or a power gain, and a transmission/reception gain may mean an antenna gain or an RF gain.

FIG. 1 illustrates a flowchart of detecting defects of an RF circuit according to an embodiment of the disclosure.

Referring to FIG. 1, at operation S100, a test apparatus may perform an open/short circuit test for identifying whether protection diodes for preventing defects of a transistor circuit normally operate.

Further, at operation S110, the test apparatus may scan an area of an RF circuit on which a pattern is formed, by irradiating the area with laser beams, and perform a digital pattern test for detecting defects of the semiconductor wafer circuit pattern through data processing.

Further, at operation S120, the test apparatus may perform a DC/AC test for determining whether individual elements (transistors, resistors, capacitors, and diodes) of the RF circuit operate normally, by testing parameters of electrical DC voltage and current characteristics with respect to the individual elements.

Thereafter, at operation S130, the RF circuit may be packaged through wire bonding and molding processes, for interconnection and power supply.

At operation S140, the test apparatus may perform a final test for testing electrical characteristics and functions of the RF circuit in environments at room temperature, low temperature, and the like.

In FIG. 1, identifying whether a transmission/reception gain of the RF circuit is normal may be performed in the final test stage, the transmission/reception gain representing how well the RF circuit converts an input power into radio waves propagating in a designated direction and how well the RF circuit converts the radio waves propagated in a specific direction into the power.

However, in case of performing the test process described above with reference to FIG. 1, there may be a problem in that an RF circuit of which the transmission/reception gain is lower than a normal range is unnecessarily packaged in a process of manufacturing an RF circuit. Accordingly, there is a need for a method for solving this problem.

Figure 2:
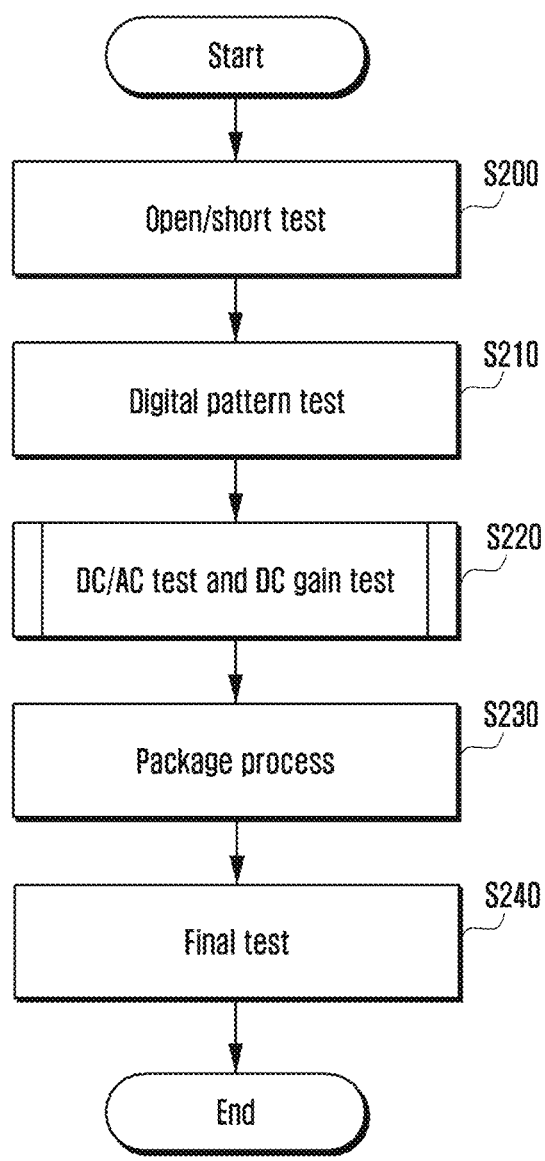
FIG. 2 illustrates a flowchart of detecting defects of an RF circuit according to an embodiment of the disclosure.

FIG. 2 illustrates a flowchart of detecting defects of an RF circuit according to an embodiment of the disclosure.

Particularly, FIG. 2 illustrates a test method capable of estimating the transmission/reception gain of the RF circuit using the DC voltage gain, and detecting the defects of the RF circuit through the estimated transmission/reception gain.

Referring to FIG. 2, at operation S200, the test apparatus may perform an open/short circuit test for identifying whether protection diodes for preventing damage to a transistor circuit normally operate.

At operation S210, the test apparatus may scan an area of the RF circuit on which a pattern is formed, by irradiating the area with laser beams, and perform a digital pattern test for detecting defects of the semiconductor wafer circuit pattern through data processing.

At operation S220, the test apparatus may perform a DC/AC test for determining whether individual elements (transistors, resistors, capacitors, and diodes) of the RF circuit operate, by testing parameters of electrical DC voltage and current characteristics with respect to the individual elements. Further, the test apparatus may measure a DC voltage gain of the RF transistor circuit using a test circuit of the RF circuit, and may detect the defects by estimating the transmission/reception gain of the RF transistor circuit using the correlation between the DC voltage gain and the transmission/reception gain of the RF circuit.

Thereafter, at operation S230, the RF circuit may be packaged through wire bonding and molding processes, for interconnection and power supply.

At operation S240, the test apparatus may perform a final test for testing electrical characteristics and functions of the RF circuit in environments at room temperature, low temperature, and the like.

In FIG. 2, identifying whether the transmission/reception gain of the RF circuit is normal may be estimated at operation S220, the transmission/reception gain representing how well the RF circuit converts an input power into radio waves propagating in a designated direction and how well the RF circuit converts the radio waves propagated in a specific direction into the power.

Thereafter, at operation S240, the correlation between the estimated transmission/reception gain of the RF circuit and the actually measured transmission/reception gain of the RF circuit may be re-determined, and the re-determined correlation may be used in a subsequent test process.

As described above, in case of performing the test process using the DC voltage gain, it is advantageous to detect the circuit being within an abnormal range by estimating the transmission/reception gain of the RF circuit before the packaging.

Hereinafter, the principle of detecting the defects by estimating the transmission/reception gain of the RF transistor circuit using the correlation between the DC voltage gain and the transmission/reception gain of the RF circuit in the DC/AC test stage will be described.

The following principle is merely one of various embodiments of the principle of estimating the transmission/reception gain as the DC voltage gain for convenience in explanation, and is not intended to limit the scope of the disclosure.

Figure 3:
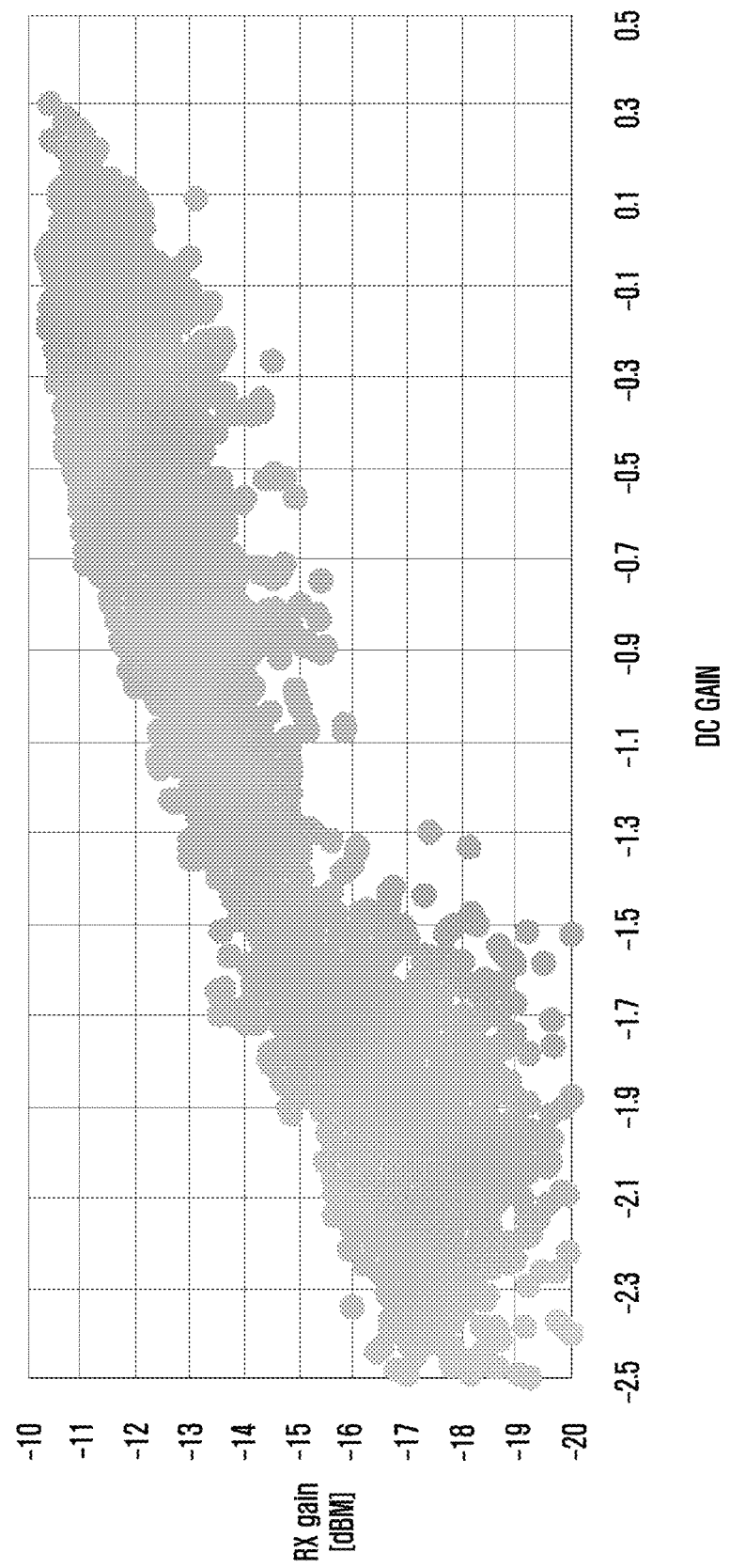
FIG. 3 illustrates a diagram of the correlation between an antenna gain and a DC gain according to an embodiment of the disclosure.

FIG. 3 illustrates a diagram of the correlation between an antenna gain and a DC gain according to an embodiment of the disclosure.

Referring to FIG. 3, the horizontal axis of the graph represents a DC gain, and the vertical axis thereof represents a transmission/reception gain. Respective points indicated in the graph represent respective RF circuits having DC gain values represented on the horizontal axis and transmission/reception gain values represented on the vertical axis.

It can be seen that the DC gain and the transmission/reception gain represented in the scatter plot have a positive correlation, and correlation coefficients can be obtained from the population. Further, the respective correlation coefficients can be separately obtained depending on whether a process corner related to components of the RF circuit is ss, tt, or ff.

As described above, because the transmission/reception gain of the RF circuit and the DC gain have the correlation, it is possible to stochastically estimate the transmission/reception gain of the RF circuit through the DC gain. Accordingly, it is possible to stochastically detect the RF circuit having an abnormal transmission/reception gain, through the DC gain test in the stage before packaging of the RF circuit.

Specifically, a method for obtaining a DC voltage gain is as follows.

A DC gain according to a small signal analysis may be obtained and represented by the following equation.

$$A_v = -g_m * r_{out}$$ Equation 1

Here, $A_v$ represents a voltage gain, $g_m$ represents a transconductance, and $r_{out}$ represents a small-signal channel resistance.

The voltage gain or DC voltage gain may mean a voltage at an output end when an input voltage is applied, and the transconductance may mean a ratio of a drain current change to a gate voltage change, and be represented by the following equation.

$$g_m = \sqrt{2(\mu_n C_{ox})\left(\frac{W}{L}\right)I_D}$$ Equation 2

Here, $I_D$ represents a drain source current, $\mu_n$ represents effective electron mobility, $C_{ox}$ represents a dielectric capacitor capacity, W represents a channel width, and L represents a channel length.

Here, the effective electron mobility $\mu_n$, the dielectric capacitor capacity $C_{ox}$, the channel width W, and the channel length L are values determined by processes, and in the DC test and DC gain test stages, the accurate values thereof are difficult to know.

However, using a proportional relationship through the above equation, the voltage gain may be represented as follows.

$$A_v \propto I_D^{1/2} * r_{out}$$ Equation 3

Alternatively, the voltage gain can be expressed as $DC_{gain}=20 \log(I_{DS1}*R_{out})$ through a log scale.

That is, under the assumption that the process deviation is not high, it is possible to stochastically detect the RF circuit having an abnormal transmission/reception gain based on the drain source current and the small-signal channel resistance.

Further, in order to estimate the transmission/reception gain through the correlation with the transmission/reception gain in consideration of the process deviation and edge effects, the relationship may be derived as in the following equation.

$$A_v \propto I_D^n \times r_{out}^m$$ Equation 4

Here, n and m are arbitrary real numbers.

Alternatively, the gain can be expressed as $RF_{gain}=20N \log(I_{DS1})+20M*\log(R_{out})$ through a log scale.

Figure 4:
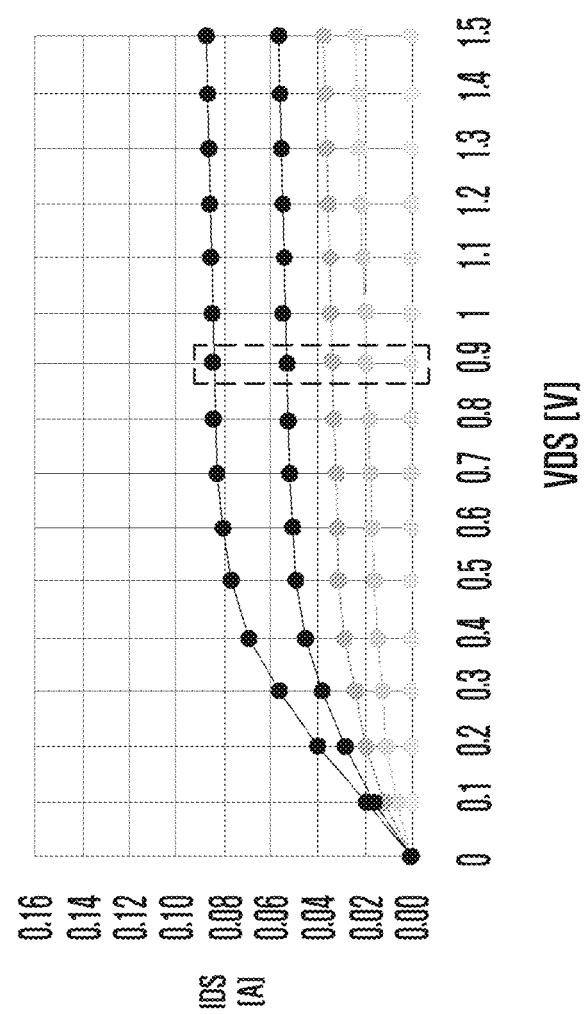
FIG. 4 illustrates a diagram of the relationship between a drain source voltage and a drain source current depending on a gate voltage of a transistor circuit according to an embodiment of the disclosure.

FIG. 4 illustrates a diagram of the relationship between a drain source voltage and a drain source current depending on a gate voltage of an RF transistor circuit according to an embodiment of the disclosure.

Specifically, FIG. 4 illustrates an embodiment for obtaining the above-described $r_{out}$ and small-signal channel resistance. As a method for obtaining the small-signal channel resistance, there is a method for using a drain voltage, a source voltage, and a drain source current.

The small-signal channel resistance can be represented by the following equation in case that a gate source voltage is constant.

$$r_{out} = \frac{\Delta V_{DS}}{\Delta I_{DS}}$$ Equation 5

Here, $\Delta V_{DS}$ represents a drain source voltage variation, $\Delta I_{DS}$ represents a drain source current variation, and $r_{out}$ represents a small-signal channel resistance.

That is, if the drain source voltage variation and the drain source current variation are known, it is possible to determine the small-signal channel resistance.

Hereinafter, description will be made about a method and an apparatus capable of detecting defects of a circuit by measuring or determining a drain source voltage variation, a drain source current variation, and a drain source current in a DC test stage, a method and an apparatus capable of detecting defects of a circuit by estimating a DC gain, or a method and an apparatus capable of detecting defects of a circuit by estimating a transmission/reception gain.

Figure 5A:
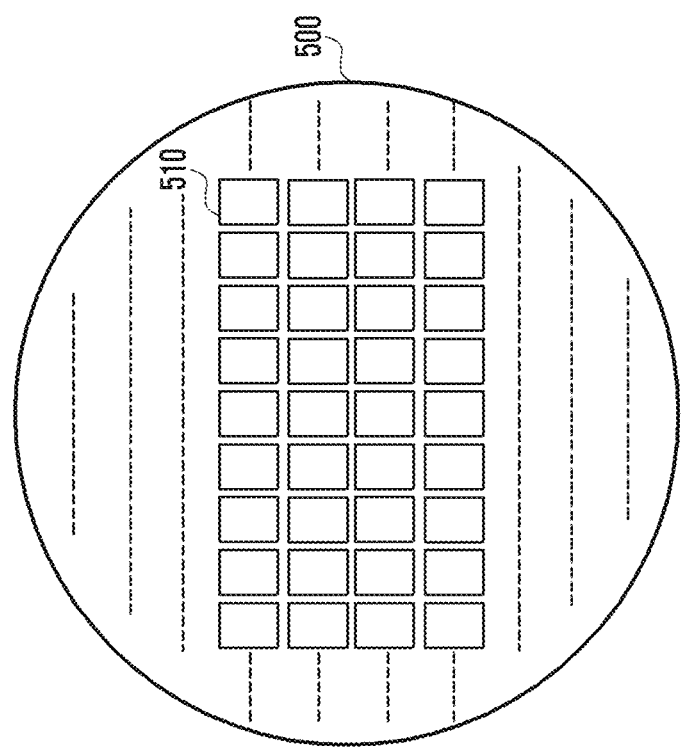
FIG. 5A illustrates a diagram of an RF circuit located on a wafer according to an embodiment of the disclosure.

FIG. 5A illustrates a diagram of an RF circuit located on a wafer according to an embodiment of the disclosure.

A wafer 500 of FIG. 5A is a substrate for manufacturing integrated circuits, and in the disclosure, the wafer may be a wafer in a stage before packaging. Further, RF circuits 510 are individual circuits located on the wafer 500, and specifically, may be circuits for performing a DC test as the RF circuits in the stage before the packaging. In case of performing the DC test, the RF circuits 510 may be tested through a test apparatus in sequence or in parallel.

Figure 5B:
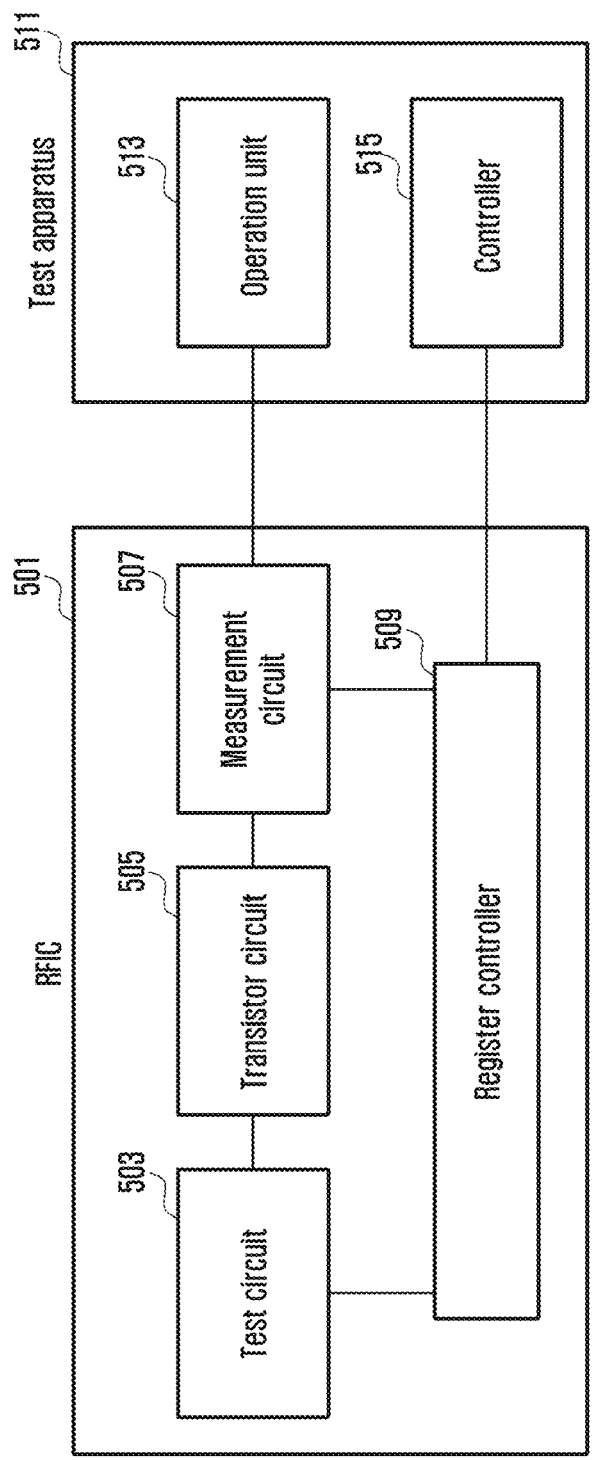
FIG. 5B illustrates a block diagram of an RF circuit and a test apparatus according to an embodiment of the disclosure.

FIG. 5B illustrates a block diagram of an RF circuit and a test apparatus according to an embodiment of the disclosure.

An RF circuit 501 of FIG. 5B is illustrated to include a test circuit 503, an RF transistor circuit 505, a measurement circuit 507, and a register controller 509, but is not limited thereto. That is, the test circuit 503, the RF transistor circuit 505, the measurement circuit 507, and the register controller 509 may not be included in the RF circuit 501, but may exist as one physically independent constituent element.

The test circuit 503 may generate current or may apply a voltage to measure a DC gain of the RF transistor circuit 505. For example, the test circuit 503 may include a precision current generation device or a power applying device, a reference resistor, and a voltage change device. Further, the test circuit 503 may generate the current or may apply a voltage to measure the DC gain of the RF transistor circuit 505 through signal transfer with the register controller 509 or the test apparatus 511.

The RF transistor circuit 505 may amplify a signal for transmission/reception of a radio signal, may transmit and receive the signal with another device, or may perform frequency synthesis.

The measurement circuit 507 performs a function of measuring the DC gain of the RF transistor circuit 505. Further, under the control of the register controller 509, the measurement circuit 507 may measure at least one of voltage, current, and resistance values for estimating the DC gain of the RF transistor circuit 505, and may transmit the measured value to the test apparatus. Further, the measurement circuit 507 may be included in the test apparatus 511, and may measure at least one of the voltage, current, and resistance values for estimating the DC gain of the RF transistor circuit 505 of the RF circuit to transmit the measured value to the test apparatus. For example, the measurement circuit 507 may be an analog-to-digital converter (ADC) performing a function of converting an analog electrical signal into a digital electrical signal.

The register controller 509 may serve to control at least one of the test circuit 503, the RF transistor circuit 505, and the measurement circuit 507. For example, the register controller 509 may control to generate the current of the test circuit 503 or to apply the voltage. Further, the register controller 509 may control the measurement circuit 507 to measure at least one of voltage, current, and resistance values for estimating the DC gain of the RF transistor circuit 505 and to transmit the measured value to the test apparatus. Further, the register controller 509 may be controlled by the controller 515 of the test apparatus. Specifically, the register controller 509 may control the test circuit to generate the generation current in order to identify the reference resistance, may control the test circuit to apply a first drain voltage of the RF transistor circuit in order to determine a first drain source current of the RF transistor circuit, and may control the test circuit to apply a second drain voltage of the RF transistor circuit in order to determine a second drain source current of the RF transistor circuit.

A test apparatus 511 of FIG. 5B is illustrated to include an arithmetic unit 513 and a controller 515, but is not limited thereto. That is, the arithmetic unit 513 and the controller 515 may not be included in the test apparatus 511, but may exist as one physically independent constituent element.

The arithmetic unit 513 may perform various operations for estimating or measuring the DC gain through reception of at least one of the voltage, current, and resistance values for estimating the DC gain measured by the measurement circuit 507. Further, the operation unit may estimate the transmission/reception gain based on at least one of the voltage, current, and resistance values measured by the measurement circuit 507.

The arithmetic unit 513 may detect the defects of the RF circuit. For example, the arithmetic unit 513 may detect the defects of the circuit based on at least one of the voltage, current, and resistance values measured by the measurement circuit 507. Further, the arithmetic unit 513 may detect the defects of the circuit by measuring or estimating the DC gain based on at least one of the voltage, current, and resistance values measured by the measurement circuit 507. Further, the arithmetic unit 513 may detect the defects of the circuit by estimating the transmission/reception gain based on at least one of the voltage, current, and resistance values measured by the measurement circuit 507.

The controller 515 may perform various operations of the test apparatus according to embodiments of the disclosure by controlling states and operations of all constituent elements included in the test apparatus. Specifically, the controller 515 generates the generation current of the test circuit, and identifies a reference resistance by measuring a potential difference between both ends of the reference resistor. Further, the controller 515 may control to: determine a first drain source current of the RF transistor circuit based on the reference resistance and a first drain voltage of the RF transistor circuit, being applied by the test circuit, determine a second drain source current of the RF transistor circuit based on the reference resistance and a second drain voltage of the RF transistor circuit, being applied by the test circuit, determine a drain resistance based on the first drain voltage, the second drain voltage, the first drain source current, and the second drain source current, and perform a test of the RF circuit based on the drain resistance, the first drain source current, and a predetermined threshold value.

Figure 6:
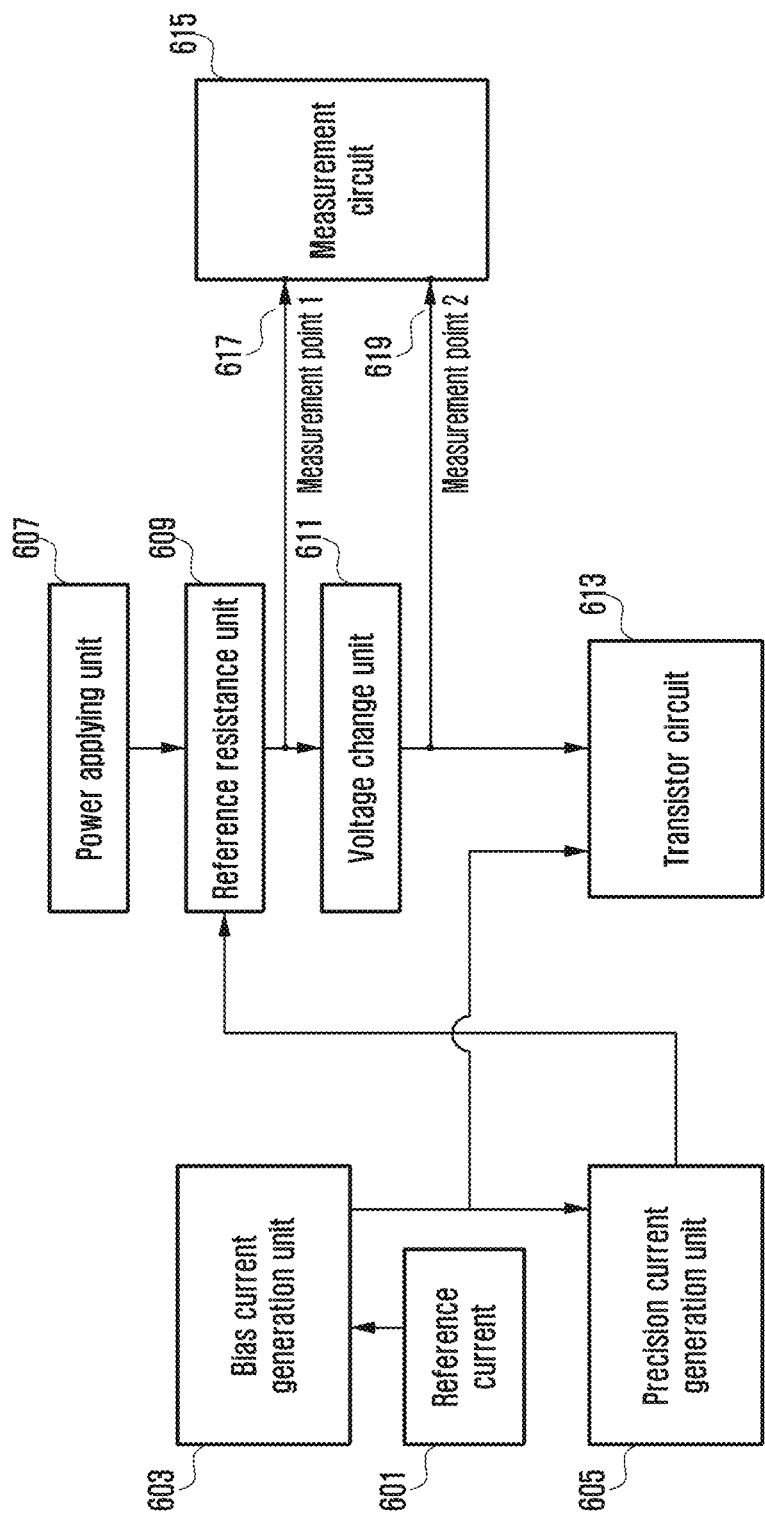
FIG. 6 illustrates a block diagram of an RF circuit according to an embodiment of the disclosure.

FIG. 6 illustrates a block diagram of an RF circuit according to an embodiment of the disclosure.

Referring to FIG. 5B and FIG. 6, a reference current 601, a bias current generation unit 603, a precision current generation unit 605, a power applying unit 607, a reference resistance unit 609, and a voltage change unit 611 may be included in a test circuit 503.

The reference current 601 and the bias current generation unit 603 may generate and apply current to the precision current generation unit 605 and an RF transistor circuit 613. Specifically, they may apply the current to the precision current generation unit 605 and the RF transistor circuit 613 using a current mirror circuit controlling the current flowing toward a load through adjustment of the current of the transistor.

The precision current generation unit 605 may generate a precision current using the current applied from the bias current generation unit 603. This is for precise measurement of the reference resistance unit 609. Generally, in case of a resistor, because it is difficult to know the precise value thereof in a manufacturing stage, the resistance value may be precisely measured using the potential difference and current between both ends of the resistor. Further, in comparison with a general current mirror circuit, the precision current generation unit 605 can supply a more precise current to the load in consideration of the channel length of the transistor located in the precision current generation unit 605 as a specific length.

The power applying unit 607 may apply a power for precise measurement of the reference resistance unit 609. Generally, in case of the resistor, because it is difficult to know the precise value thereof in the manufacturing stage, it is required to know the potential difference between the both ends of the resistor.

The reference resistance unit 609 may be used to determine the drain source current. The resistance value of the reference resistance unit may be determined as the measured voltage value of the precision current generation unit 605, the power applying unit 607, and the measurement circuit 615.

The voltage change unit 611 may be used to determine the drain source current, and may be used to measure a channel resistance for determining the DC gain. The voltage change unit 611 may change the voltage under the control of the register controller or the controller of the test apparatus, and may apply the changed voltage to the RF transistor circuit. For example, the voltage change unit 611 may apply the voltage to the drain terminal of the RF transistor circuit, or may change the voltage applied thereto.

The RF transistor circuit 613 may amplify a signal for transmission/reception of a radio signal, may transmit and receive the signal with another device, or may perform frequency synthesis. According to the disclosure, in order to detect the defects of the RF transistor circuit 613, the drain voltage may be applied or changed by the voltage change unit 611. Specifically, in order to estimate or measure the DC gain, the drain voltage may be applied or changed by the voltage change unit 611.

The measurement circuit 615 performs a function of measuring the DC gain of the RF transistor circuit 613. Further, under the control of the register controller, the measurement circuit 615 may measure at least one of the voltage, current, and resistance values for estimating the DC gain of the RF transistor circuit 613, and may transmit the measured value to the test apparatus. For example, the measurement circuit 615 may be an analog-to-digital converter (ADC) performing a function of converting an analog electrical signal into a digital electrical signal.

Specifically, in order to determine the resistance value of the reference resistance unit 609, the measurement circuit 615 may measure the voltage at measurement point 1 617, and may transmit the potential difference with the power applying unit 607 and the generation current value generated by the precision current generation unit 605 to the test apparatus. Further, in order to determine the resistance value of the reference resistance unit 609, the measurement circuit 615 may measure the voltage at measurement point 1 617, and may determine the resistance value of the reference resistance unit 609 through the potential difference with the power applying unit 607 and the generation current value generated by the precision current generation unit 605.

Further, the measurement circuit 615 may measure the voltage at measurement point 2 619 to measure the voltage value applied to the RF transistor circuit (613). For example, the measurement circuit 615 may measure the voltage value applied to the RF transistor circuit (613) or the drain voltage. Further, the measurement circuit 615 may transmit the voltage value applied to the RF transistor circuit (613) or the voltage value of the drain voltage. Further, the measurement circuit 615 may determine the drain source current value based on the voltage value applied to the RF transistor circuit (613) or the voltage value of the drain voltage and the resistance value of the reference resistance unit 609.

Figure 7:
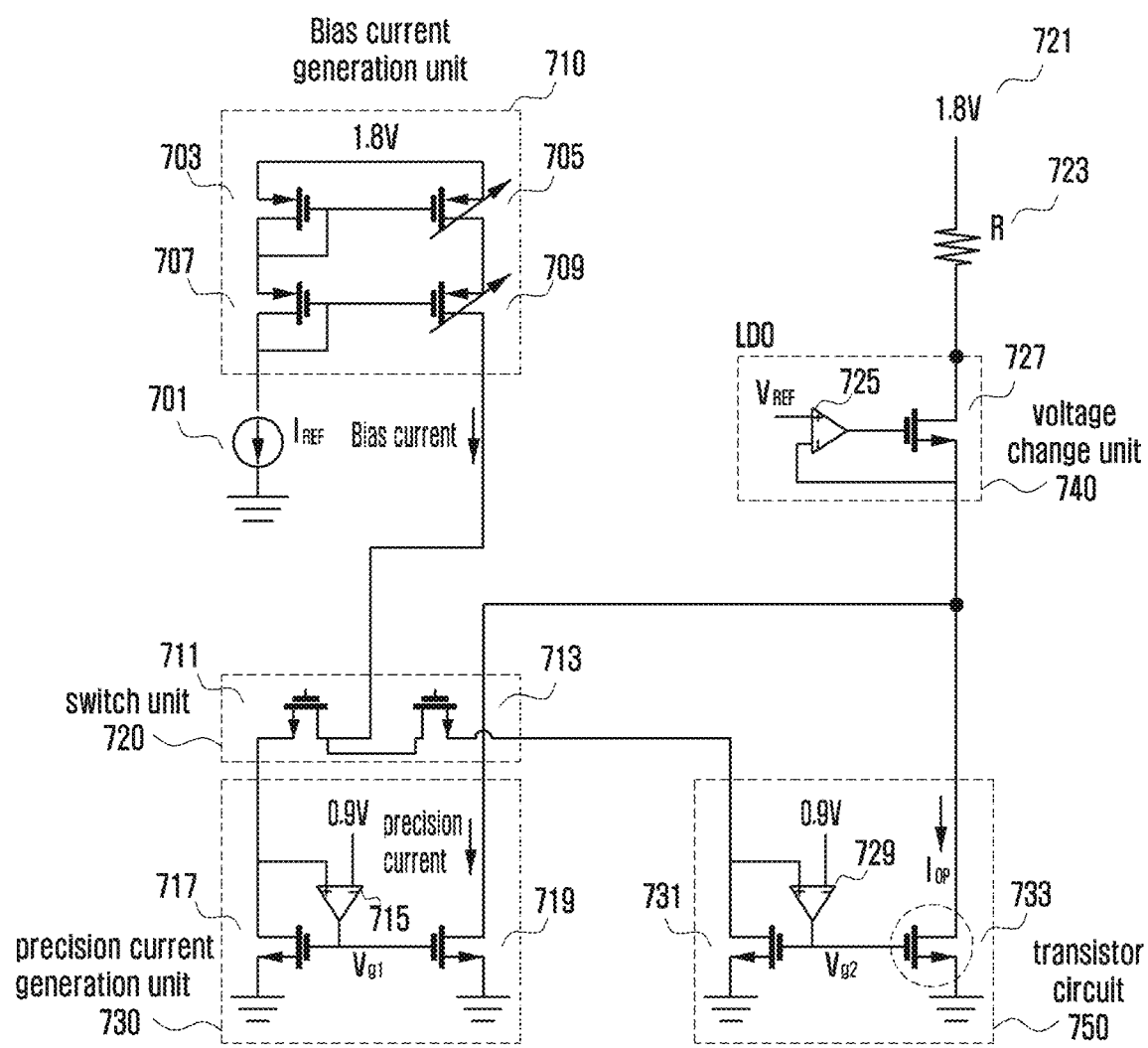
FIG. 7 illustrates a circuit diagram of an RF circuit according to an embodiment of the disclosure.

FIG. 7 illustrates a circuit diagram of an RF circuit according to an embodiment of the disclosure.

FIG. 7 is merely an example of a detailed circuit diagram of the block diagram for performing the function of FIG. 6, and is not intended to limit the rights of the disclosure.

Referring to FIG. 7, transistors 703, 705, 707, and 709 for generating bias current may configure a bias current generation unit 710. Specifically, the transistors 703, 705, 707, and 709 may generate the bias current based on reference current 701. For example, the bias current generation unit may be implemented through a cascode configuration of a PMOS-based bias mirror circuit. The bias current generation unit 710 as configured above may reduce the change of the bias current being generated in accordance with the voltage value of a node from which the bias current is output.

Transistors 711 and 713 for a bias current switch may configure a switch unit 720. Specifically, the transistors 711 and 713 for the bias current switch may determine the direction of the bias current. For measurement of a reference resistance, the first transistor 711 for the bias current switch may determine the direction of the bias current as the direction of the precision current generation unit 730. The second transistor 713 for the bias current switch may determine the direction of the bias current as the direction of an RF transistor circuit 750.

Transistors 717 and 719 for precision current generation and an OP-AMP 715 for precision current generation may configure a precision current generation unit 730. Specifically, the OP-AMP 715 for the precision current generation may adjust a gate voltage of the first transistor 717 for generating the precision current so as to maintain a constant drain voltage of the first transistor 717 for the precision current generation. In this case, the drain voltage can be constantly maintained by an OP-AMP 725 for the drain voltage or voltage change of the second transistor 719 for the precision current generation. The transistors 717 and 719 for the precision current generation may have a very long channel length to reduce the change by the process deviation.

A power applying circuit 721 may perform a role of a power applying unit.

A reference resistance circuit 723 may perform a role of a reference resistance unit.

The OP-AMP 725 for changing the drain voltage and a transistor 727 for changing the drain voltage may configure a voltage change unit 740. Specifically, in order to change the drain voltage of the RF transistor circuit, the gate bias of the transistor 727 for changing the drain voltage may be adjusted so that the voltage applied to both terminals of the OP-AMP 725 for changing the drain voltage becomes equal to the drain voltage. In this case, the range of change of the drain source current and the drain voltage may be set as a range in which a saturation region operation is possible.

Transistors 731 and 733 for the RF transistor circuit and an OP-AMP 729 for the RF transistor circuit may perform a role of the RF transistor circuit 750.

Hereinafter, a detailed example in which respective elements of FIG. 7 operate in a DC gain test stage will be described.

The test apparatus may control the test circuit to generate bias current using the reference current 701 and the transistors 703, 705, 707, and 709 for generating the bias current. Specifically, the test apparatus may apply the reference current to the bias current generation unit 710, and may generate the bias current through the cascode configuration of the PMOS-based bias mirror circuit of the transistors 703, 705, 707, and 709 for generating the bias current.

Thereafter, the test apparatus may apply the current to the precision current generation unit 730 through the first transistor 711 for the bias current switch for the precise measurement of the reference resistor 723.

When the current is applied to the precision current generation unit 730, the OP-AMP for generating the precision current may adjust the gate voltage of the first transistor 717 for the precision current generation so as to constantly maintain the drain voltage of the first transistor 717 for the precision current generation at 0.9 V. In this case, the drain voltage can be constantly maintained by the OP-AMP 725 for the drain voltage change of the second transistor 719 for the precision current generation. For example, the drain voltage may be determined depending on processes or designs. For example, the drain voltage may be 0.9 V, but is not limited thereto. As described above, in case that the constant drain voltage of the transistors 717 and 719 for the precision current generation is maintained, the precision current can be supplied to the reference resistor 723.

The test apparatus may control to measure a potential difference between both ends of the reference resistor 723. Specifically, the test apparatus may measure a voltage at any one terminal of the reference resistor 723. The test apparatus may determine a resistance value of the reference resistor based on the precision current and the potential difference between both ends of the reference resistor 723 or the power applying circuit 721.

Thereafter, the test apparatus may control to apply the current to the RF transistor circuit 750 through the second transistor 713 for the bias current switch for the precision measurement of the reference resistor 723, and control the voltage change unit to apply a first voltage to the RF transistor circuit 750. In this case, the first voltage may be lower or higher than a normal operating voltage of the RF transistor circuit 750. The test apparatus may measure a first drain voltage, and may determine a first drain source current based on the reference resistor 723 and the voltage of the power applying device.

Thereafter, the test apparatus may control the voltage change unit to apply a second voltage to the RF transistor circuit 750. In this case, the second voltage may be a second drain voltage. Alternatively, the second voltage may be lower or higher than the normal operating voltage of the RF transistor circuit 750. The test apparatus may measure a second drain voltage, and may determine a second drain source current based on the voltages of the reference resistor 723 and the power applying device.

The test apparatus may measure a drain resistance based on the first drain voltage, the second drain voltage, the first drain source current, and the second drain source current.

The test apparatus may detect defects of the RF circuit based on the drain resistance, the first drain source current, and a predetermined threshold value. Specifically, in case that a product of the drain resistance and the first drain source current is equal to or smaller than the predetermined threshold value, the test apparatus may determine that the circuit is defective. Further, in case that a DC gain that is determined or estimated based on the drain resistance and the first drain source current is equal to or smaller than the predetermined threshold value, the test apparatus may determine that the circuit is defective. Further, in case that the transmission/reception gain that is determined or estimated based on the drain resistance and the first drain source current is equal to or smaller than the predetermined threshold value, the test apparatus may determine that the circuit is defective.

Figure 8:
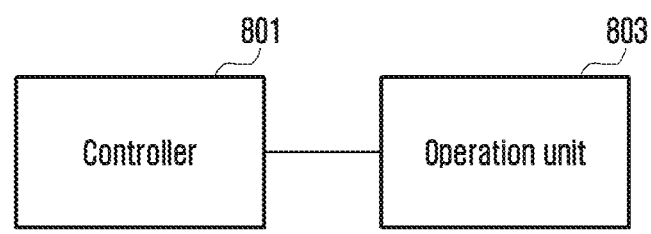
FIG. 8 illustrates a block diagram of a test apparatus according to an embodiment of the disclosure.

FIG. 8 illustrates a block diagram of a test apparatus according to an embodiment of the disclosure.

A test apparatus of FIG. 8 is illustrated to include an arithmetic unit 803 and a controller 801, but is not limited thereto. That is, the arithmetic unit 803 and the controller 801 may not be included in the test apparatus, but may exist as one physically independent constituent element.

The arithmetic unit 803 may perform various operations for estimating or measuring the DC gain through reception of at least one of the voltage, current, and resistance values for estimating the DC gain measured by the measurement circuit. Further, the operation unit may estimate the transmission/reception gain based on at least one of the voltage, current, and resistance values measured by the measurement circuit.

The arithmetic unit 803 may detect the defects of the RF circuit. For example, the arithmetic unit 803 may detect the defects of the RF circuit based on at least one of the voltage, current, and resistance values measured by the measurement circuit. Further, the arithmetic unit 803 may detect the defects of the RF circuit by measuring or estimating the DC gain based on at least one of the voltage, current, and resistance values measured by the measurement circuit. Further, the arithmetic unit 803 may detect the defects of the circuit by estimating the transmission/reception gain based on at least one of the voltage, current, and resistance values measured by the measurement circuit.

The controller 801 may perform various operations of the test apparatus according to embodiments of the disclosure by controlling states and operations of all constituent elements included in the test apparatus. Specifically, the controller 801 may control to generate the generation current of the test circuit, identify a reference resistance by measuring a potential difference between both ends of a reference resistor, determine a first drain source current of the RF transistor circuit based on the reference resistance and a first drain voltage of the RF transistor circuit, being applied by the test circuit, determine a second drain source current of the RF transistor circuit based on the reference resistance and a second drain voltage of the RF transistor circuit, being applied by the test circuit, determine a drain resistance based on the first drain voltage, the second drain voltage, the first drain source current, and the second drain source current, and perform a test of the RF circuit based on the drain resistance, the first drain source current, and a predetermined threshold value.

Figure 9:
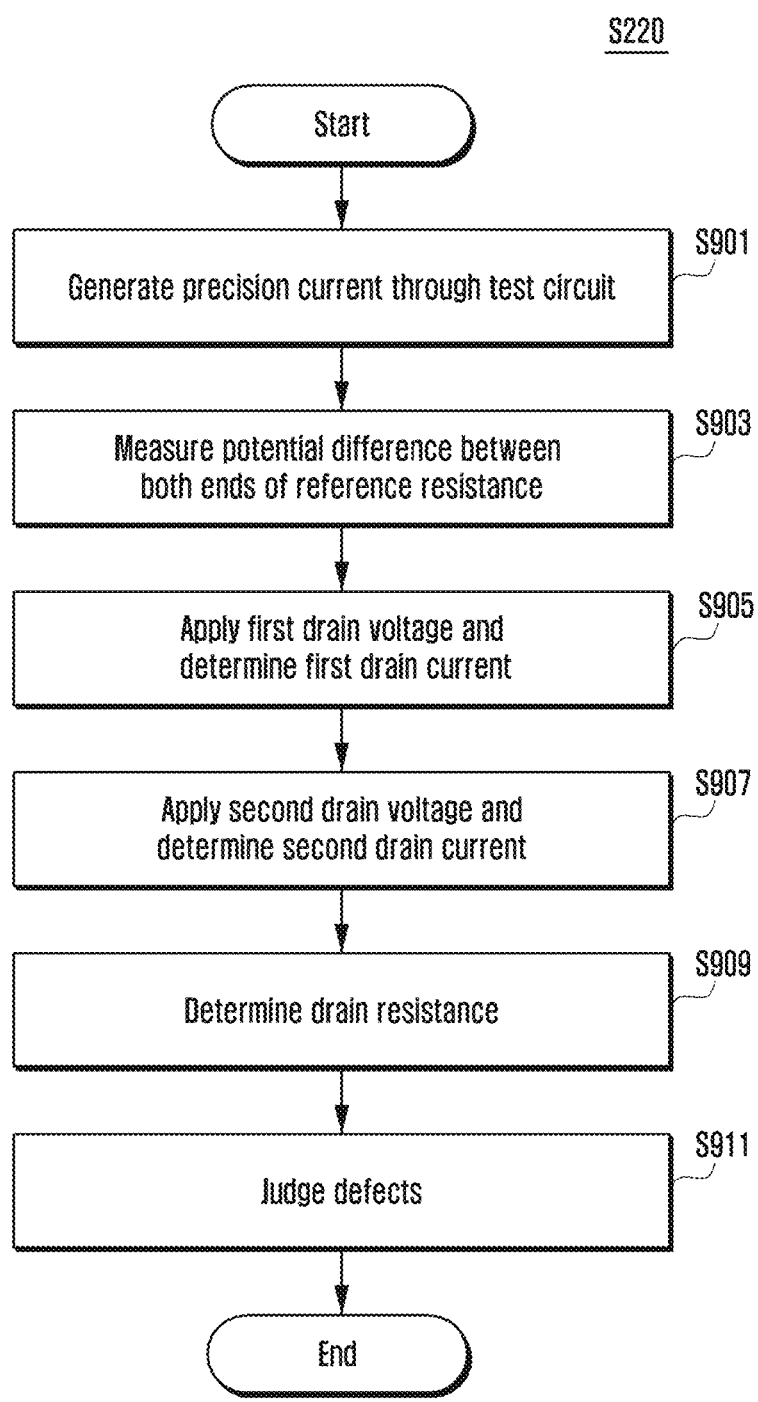
FIG. 9 illustrates a flowchart of a test apparatus performing a $DC_{gain}$ test according to an embodiment of the disclosure.

FIG. 9 illustrates a flowchart of a test apparatus performing a $DC_{gain}$ test according to an embodiment of the disclosure.

Referring to FIG. 9, the test apparatus, at operation S901, may control the test circuit to generate current. Specifically, the test apparatus may apply a reference current to a bias generation unit, and may apply a power to a power applying device. Further, the test apparatus may apply the current to a precision current generation unit through a switch, and may not apply the current to the RF transistor circuit. The precision current generation unit of the test circuit may apply a precision current to a reference resistance unit based on the applied current.

At operation 903, the test apparatus may control to measure a potential difference between both ends of the reference resistance unit. Specifically, the test apparatus may measure a voltage on at least one terminal of the reference resistance unit. The test apparatus may determine a resistance value of the reference resistance unit based on the precision current and the potential difference between the both ends of the reference resistance unit or the power applying device. This is represented by the following equation.

$$R_{ref} = \frac{V_R}{I_R} \qquad \text{Equation 6}$$

Here, $R_{ref}$ represents a resistance value of the reference resistance unit, $V_R$ represents a voltage difference between both ends of the reference resistance unit, and $I_R$ denotes a generation current of the precision current generation unit.

At operation S905, the test apparatus may determine a first drain current. Specifically, the test apparatus may apply current to an RF transistor circuit without applying the current to a precision current generation unit through a switch. Further, a voltage change unit may control to apply a first voltage to the RF transistor circuit. In this case, the first voltage may be a first drain voltage. Further, in this case, the first voltage may be lower or higher than a normal operating voltage of the RF transistor circuit. The test apparatus may measure the first drain voltage, and may determine a first drain source current based on the voltage of the power applying device and the reference resistance unit.

At operation S907, the test apparatus may determine a second drain current. Specifically, the test apparatus may apply current to the RF transistor circuit without applying the current to the precision current generation unit through the switch. Further, the voltage change unit may control to apply a second voltage to the RF transistor circuit. In this case, the second voltage may be a second drain voltage. Further, in this case, the second voltage may be lower or higher than the normal operating voltage of the RF transistor circuit. The test apparatus may measure the second drain voltage, and may determine a second drain source current based on the voltage of the power applying device and the reference resistance unit.

Determination of the drain source current is represented by the following equation.

$$I_{DS} = \frac{V_R}{R_{ref}} \qquad \text{Equation 7}$$

Here, $R_{ref}$ represents a resistance value of the reference resistance unit, $V_R$ represents a voltage difference between both ends of the reference resistance unit, and $I_{DS}$ represents a drain source current.

At operation S909, the test apparatus may determine a drain resistance based on the first drain voltage, the second drain voltage, the first drain source current, and the second drain source current. Determination of the drain resistance is represented by the following equation.

$$r_{out} = \frac{\Delta V_D}{\Delta I_{DS}} \qquad \text{Equation 8}$$

Here, $\Delta V_D$ represents a difference between the first drain voltage and the second drain voltage, $\Delta I_{DS}$ represents a difference between the first drain source current and the second drain source current, and $r_{out}$ represents a small-signal channel resistance or drain resistance.

At operation S911, the test apparatus may detect defects of the RF circuit based on the drain resistance, the first drain source current, and a predetermined threshold value. Specifically, in case that a product of the drain resistance and the first drain source current is equal to or smaller than the predetermined threshold value, the test apparatus may determine that the circuit is defective. Further, in case that a DC gain that is determined or estimated based on the drain resistance and the first drain source current is equal to or smaller than the predetermined threshold value, the test apparatus may determine that the circuit is defective. Further, in case that the transmission/reception gain that is determined or estimated based on the drain resistance and the first drain source current is equal to or smaller than the predetermined threshold value, the test apparatus may determine that the circuit is defective.

According to the embodiment of the disclosure described above, it is possible to efficiently detect the defects of the RF circuit by detecting the defects of the RFIC circuit through estimation of the RF gain through the DC test before the package process.

Although the present disclosure has been described with various embodiments, various changes and modifications may be suggested to one skilled in the art. It is intended that the present disclosure encompass such changes and modifications as fall within the scope of the appended claims.

What is claimed is:

1. A method by a test apparatus for testing a radio frequency (RF) circuit, the method comprising:
controlling a test circuit of the RF circuit to generate a DC current and identifying a reference resistance by measuring a potential difference between a first end and a second end of a reference resistor;
determining a first drain source current of a transistor circuit based on the reference resistance and a first drain voltage of the transistor circuit, being applied by the test circuit;
determining a second drain source current of the transistor circuit based on the reference resistance and a second drain voltage of the transistor circuit, being applied by the test circuit;
identifying a drain resistance based on the first drain voltage, the second drain voltage, the first drain source current, and the second drain source current; and
performing a test of the RF circuit based on the drain resistance, the first drain source current, and a first threshold value.

2. The method of claim 1, wherein performing the test comprises:
determining a DC voltage gain of the transistor circuit based on the drain resistance and the first drain source current.

3. The method of claim 2, wherein performing the test further comprises:
determining that the RF circuit has defects in case that the DC voltage gain is equal to or smaller than the first threshold value.

4. The method of claim 3, wherein the DC voltage gain is calculated by:

$$DC_{gain} = 20\log(I_{DS1} * R_{out})$$

wherein $DC_{gain}$ represents the DC voltage gain, $I_{DS1}$ represents the first drain source current, and $R_{out}$ represents the drain resistance.

5. The method of claim 1, further comprising:
estimating an RF voltage gain of the transistor circuit based on the drain voltage and the first drain source current.

6. The method of claim 5, further comprising:
    detecting that the RF circuit has defects in case that the RF voltage gain is equal to or smaller than a second threshold value.

7. The method of claim 6, wherein the RF voltage gain is estimated by:

$$RF_{gain}=20N \log(I_{DS1})+20M^*\log(R_{out})$$

wherein N and M represent arbitrary real numbers, $RF_{gain}$ represents the RF voltage gain, $I_{DS1}$ represents the first drain source current, and $R_{out}$ represents the drain resistance.

8. A test apparatus for performing a test based on a DC voltage gain, the test apparatus comprising:
    an operation unit configured to perform an operation based on a voltage or current measured by a test circuit and an analog-to-digital converter (ADC) in an RF circuit; and
    a controller configured to:
        control the test circuit to generate a DC current and identify a reference resistance by measuring a potential difference between a first end and a second end of a reference resistor,
        determine a first drain source current of a transistor circuit based on the reference resistance and a first drain voltage of the transistor circuit, being applied by the test circuit,
        determine a second drain source current of the transistor circuit based on the reference resistance and a second drain voltage of the transistor circuit, being applied by the test circuit,
        identify a drain resistance based on the first drain voltage, the second drain voltage, the first drain source current, and the second drain source current, and
        perform a test of the RF circuit based on the drain resistance, the first drain source current, and a first threshold value.

9. The test apparatus of claim 8, wherein the controller is configured to:
    determine a DC voltage gain of the transistor circuit based on the drain voltage and the first drain source current.

10. The test apparatus of claim 9, wherein the controller is further configured to:
    detect that the RF circuit has defects in case that the DC voltage gain is equal to or smaller than the first threshold value.

11. The test apparatus of claim 10, wherein the DC voltage gain is calculated by:

$$DC_{gain}=20 \log(I_{DS1}^*R_{out})$$

wherein $DC_{gain}$ represents the DC voltage gain, $I_{DS1}$ represents the first drain source current, and $R_{out}$ represents the drain resistance.

12. The test apparatus of claim 8, wherein the controller is further configured to:
    estimate an RF voltage gain of the transistor circuit based on the drain voltage and the first drain source current.

13. The test apparatus of claim 12, wherein the controller is further configured to:
    detect that the RF circuit has defects in case that the RF voltage gain is equal to or smaller than a second threshold value.

14. The test apparatus of claim 13, wherein the RF voltage gain is estimated by:

$$RF_{gain}=20N \log(I_{DS1})+20M^*\log(R_{out})$$

wherein N and M represent arbitrary real numbers, $RF_{gain}$ represents the RF voltage gain, $I_{DS1}$ represents the first drain source current, and $R_{out}$ represents the drain resistance.

15. A radio frequency (RF) circuit for performing a test based on a DC voltage gain, the RF circuit comprising:
    a transistor circuit configured to transmit and receive signals;
    a test circuit configured to generate a DC current for the test and apply a drain voltage to the transistor circuit; and
    a register controller configured to:
        control the test circuit to generate a DC current to identify a reference resistance,
        control the test circuit to apply a first drain voltage to the transistor circuit to determine a first drain source current of the transistor circuit, and
        control the test circuit to apply a second drain voltage to the transistor circuit to determine a second drain source current of the transistor circuit,
    wherein the register controller is a controller configured to control an RF test apparatus to identify a drain resistance and detect defects by measuring a DC gain.

16. The RF circuit of claim 15, wherein the test circuit comprises a current generation circuit, a reference resistor, and a voltage change device.

* * * * *